United States Patent
Han

(10) Patent No.: US 9,435,019 B2
(45) Date of Patent: Sep. 6, 2016

(54) MASK

(71) Applicant: Samsung Display Co., Ltd., Yongin (KR)

(72) Inventor: Jeong-Won Han, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 129 days.

(21) Appl. No.: 14/017,057

(22) Filed: Sep. 3, 2013

(65) Prior Publication Data

US 2014/0331925 A1 Nov. 13, 2014

(30) Foreign Application Priority Data

May 10, 2013 (KR) ........................ 10-2013-0053238

(51) Int. Cl.
| | |
|---|---|
| H01L 51/56 | (2006.01) |
| C23C 14/04 | (2006.01) |
| B05C 21/00 | (2006.01) |
| B05C 17/06 | (2006.01) |
| B05D 1/32 | (2006.01) |
| H05K 3/34 | (2006.01) |
| H01L 51/00 | (2006.01) |

(52) U.S. Cl.
CPC ............. *C23C 14/042* (2013.01); *B05C 17/06* (2013.01); *B05C 21/005* (2013.01); *B05D 1/32* (2013.01); *H01L 51/0011* (2013.01); *H05K 3/3452* (2013.01)

(58) Field of Classification Search
CPC ....... B05C 21/005; B05C 17/06; B05D 1/32; B05B 15/04; B05B 15/045; H05K 3/3452; H05K 3/3468; C23C 14/042; H01L 51/0011
USPC ......... 118/504, 505, 720, 721; 313/402–408; 228/39; 430/5; 156/345.3
See application file for complete search history.

(56) References Cited

U.S. PATENT DOCUMENTS

| | | | | |
|---|---|---|---|---|
| 3,829,983 | A * | 8/1974 | White | F26B 3/082 34/583 |
| 3,944,867 | A * | 3/1976 | Kaplan | 313/403 |
| 4,626,737 | A * | 12/1986 | Takenaka et al. | 313/402 |
| 5,790,283 | A * | 8/1998 | Catanzaro | G02B 5/188 359/15 |
| 6,372,647 | B1 * | 4/2002 | Lu | H01L 21/76807 257/E21.579 |
| 2007/0003839 | A1 * | 1/2007 | Rabarot et al. | 430/5 |

FOREIGN PATENT DOCUMENTS

| | | |
|---|---|---|
| KR | 10-2003-0077370 | 10/2003 |
| KR | 10-2005-0120170 | 12/2005 |
| KR | 10-2006-0057842 | 5/2006 |
| KR | 10-2007-0002553 | 1/2007 |
| KR | 10-2011-0120700 | 11/2011 |

* cited by examiner

*Primary Examiner* — Laura Edwards

(74) *Attorney, Agent, or Firm* — H.C. Park & Associates, PLC

(57) ABSTRACT

A mask includes a plate-shaped body including openings, and a modified portion including at least one first curved portion protruding from the plate-shaped body in a first direction and longitudinally extending in a second direction.

23 Claims, 12 Drawing Sheets

MASK

CROSS-REFERENCE TO RELATED APPLICATION

This application claims priority from and the benefit of Korean Patent Application No. 10-2013-0053238, filed on May 10, 2013, which is incorporated by reference for all purposes as if set forth herein.

BACKGROUND

1. Field

Exemplary embodiments relate to manufacturing technology, and, more particularly, to a mask.

2. Discussion

A fine metal mask (FMM) is a type of mask for depositing an organic material on a relatively large substrate. To manufacture an organic light emitting display device using a deposition process, the fine metal mask (FMM) is typically patterned with the same pattern as an intended pattern to be deposited as a thin film, and the like, on a substrate.

Conventionally, FMMs have been manufactured by various methods, such as, for instance, a metal etching process, a laser process, a photolithography process, an electro forming process, and the like. In addition, FMMs are often manufactured by positioning a pattern on a plane. Further, the manufactured FMM is typically tensioned and welded on a mask frame to be used in a deposition process. As a result of the tension applied to a FMM, an overall thickness of the FMM is typically smaller than before tensioning. As such, when performing a cleaning process after performing the aforementioned tension welding process, a FMM may be damaged or broken due to the reduction in durability caused, at least in part, by the reduction in thickness of the FMM. To this end, as the size of a FMM increases, issues associated with the reduction in thickness and durability are exacerbated.

The above information disclosed in this Background section is only for enhancement of understanding of the background of the invention, and, therefore, it may contain information that does not form the prior art that is already known in this country to a person of ordinary skill in the art.

SUMMARY

Exemplary embodiments provide a mask configured to prevent reductions in thickness when coupled to a frame in a tensioned state.

Additional aspects will be set forth in the detailed description which follows and, in part, will be apparent from the disclosure, or may be learned by practice of the invention.

According to exemplary embodiments, a mask includes: a plate-shaped body including openings; and a modified portion including at least one first curved portion protruding from the plate-shaped body in a first direction and longitudinally extending in a second direction.

According to exemplary embodiments, a mask includes: a plate-shaped body including openings; and a modified portion including protrusions protruding from the plate-shaped body. The protrusions are disposed in a pattern.

According to exemplary embodiments, although a mask may be tensioned, a modified portion of the mask may be stretched, and, as such, the length and/or width of the mask may be modified, but the thickness of the mask may not be decreased, but substantially maintained. As such, the thickness of the entire mask is substantially maintained to have almost the same initial thickness, and, in this manner, durability is increased. To this end, it is possible to prevent (or otherwise reduce) damage or breakage due to durability issues of the mask during a tension welding process, a deposition process, and/or a cleaning process. The increased durability of the mask also increases the use time of the mask during production processing. This may also serve to reduce manufacturing costs, which, in turn, may lower costs to consumers for organic light emitting diode display devices.

According to exemplary embodiments, when the mask is tension-welded, even though a relatively high amount of tension may be applied to the mask, the mask has resistance to the external force being applied. As such, even though the length and/or width of the mask may be increased to manufacture a large-area organic light emitting diode display, the overall shape of the mask may be stably maintained. In this manner, reliability of the mask during, for example, a deposition process may be maintained.

The foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
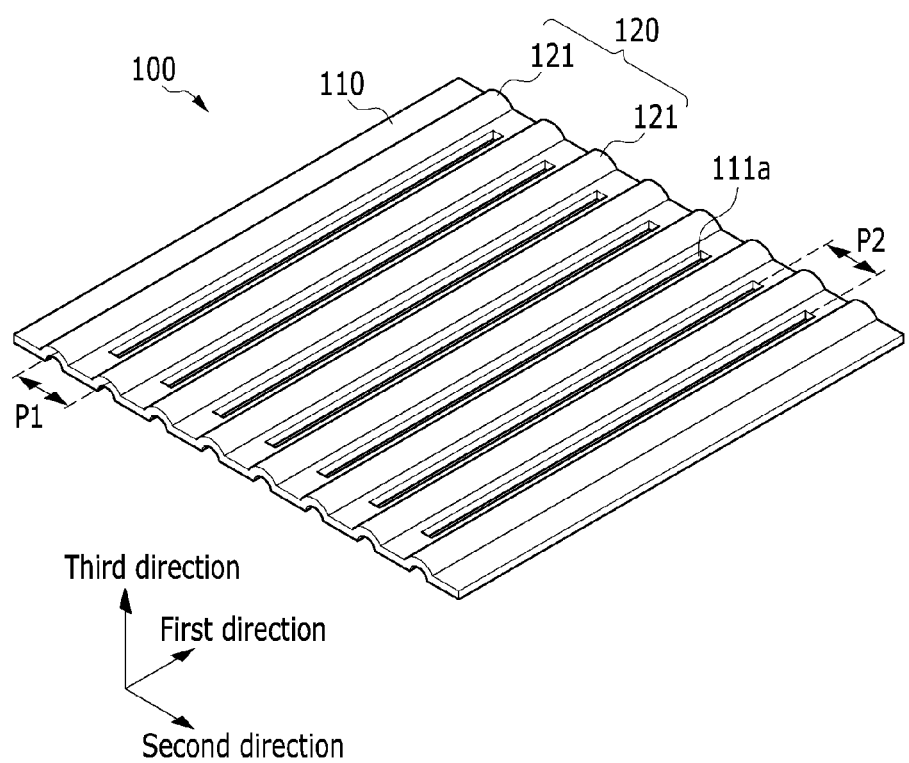
FIG. 1 is a perspective view of a mask, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a perspective view of a mask, according to exemplary embodiments.

Referring to FIG. 1, a mask 100 includes a body 110 and a modified portion 120. The body 110 may have a plate shape including a plurality of openings (or apertures) 111a formed therethrough. A first dimension of the plate shape of body 110 may extend in a first direction and a second dimension of the plate shape of the body 110 may extend in a second direction. To this end, a thickness of the plate shape of the body may extend in a third direction. It is noted that the first, second, and third directions may be perpendicular (or substantially perpendicular) to one another.

According to exemplary embodiments, the body 110 may be made of any suitable metal material having sufficient stiffness. In other words, the body 110 may be formed of a metal material with a sufficient level of stiffness that when the body 110 is coupled to a mask frame (not illustrated) via, for instance, a welding process, deformation typically caused, at least in part, by the aforementioned welding process may be prevented or at least minimized. It is also contemplated that the metal material may be selected to prevent (or otherwise reduce) deformation caused, at least in part, by the mass (or weight) of the body 110 itself. For example, the body 110 may be formed of chromium (Cr), copper (Cu), nickel (Ni), magnesium (Mg), iron (Fe), tin (Sn), titanium (Ti), aluminum (Al), stainless steel (SUS), etc., and/or one or more compounds and/or layers thereof.

According to exemplary embodiments, an opening 111a may be sized in correspondence with the size of a pixel formed on a substrate used to manufacture a display device, such as an organic light emitting display (OLED) device. It is noted that a typical OLED device may include pixels, each of which include three subpixels, such as, for instance, a green subpixel, a blue subpixel, and a red subpixel; however, any other suitable colors (such as yellow, magenta, white, etc.) and/or numbers of subpixels may be utilized. To this end, the opening 111a may be sized in correspondence to the size of the pixel, which includes the above-noted subpixel configuration. Although openings 111a are illustrated as defining polygonal openings, e.g., rectangular openings, it is contemplated that openings 111a may define any other suitably shaped opening, e.g., ovular, hexagonal, etc.

Figure 2:
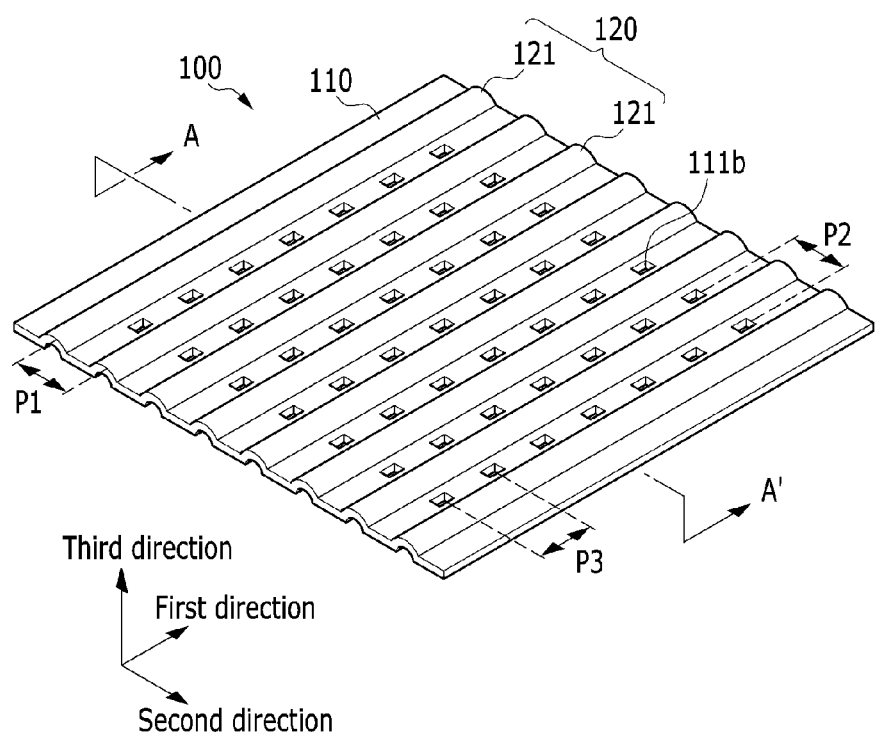
FIG. 2 is a perspective view of a modified opening in the mask of FIG. 1, according to exemplary embodiments.

FIG. 2 is a perspective view of a modified opening in the mask of FIG. 1, according to exemplary embodiments.

As illustrated in FIG. 2, openings 111b may be formed in a pattern on the body 110. The patterned openings 111b may be formed to acquire minute patterning and surface leveling effects when utilized in association with, for instance, an electro-forming method. It is contemplated, however, that the openings 111b may be manufactured using any addition or alternative method, such as, for example, an etching method, a laser processing method, and the like. When the openings 111b are manufactured via etching, a resist layer including the same pattern as the openings 111b may be formed on a thin plate using photoresist, or may be formed by etching the thin plate after attaching (or otherwise coupling) a film including the pattern on a surface of the thin plate. As with openings 111a, it is contemplated that openings 111b may define any suitably shaped opening, e.g., rectangular, hexagonal, ovular, etc.

With reference to FIGS. 1 and 2, according to exemplary embodiments, the modified portion 120 may include a plurality of first curved portions 121. Although described as first "curved" portions 121, as will become more apparent below, an axial cross-section, e.g., a cross-section taken along a sectional line extending in the second direction, of the first "curved" portions 121 may include arcuately formed features and/or linearly formed features. In exemplary embodiments, a first curved portion 121 substantially protrudes from the surface of the body 110 in the third direction, as well as longitudinally extends in the first direction. For instance, the first curved portion 121 may be configured to longitudinally extend in the first direction across the body 110 from one side to another. As with the openings 111a, 111b, the first curved portions 121 may not longitudinally extend from one side to another of the body 110, but may be disposed in determined portions of the mask 110. These determined portions of the mask 110 may be selected to counteract tensioning and/or gravitational forces, which may be later imposed upon the mask 100 when, for example, the mask 100 is welded to a mask frame.

According to exemplary embodiments, the body 110 may include any suitable number of first curved portions 121. When the modified portion 120 includes a plurality of first curved portions 121, the plurality of first curved portions 121 may be spaced apart from each other by a first dimension (or pitch) P1. To this end, although each of the first curved portions 121 are shown with a same axial cross-sectional configuration, it is contemplated that one or more of the first curved portions 121 may include different axial cross-sectional shapes. To this end, the axial cross-sectional shape of the first curved portions may change according to a position along a longitudinal dimension thereof. For instance, the first curved portion may include a first sub-portion of a first axial cross-sectional shape, a second sub-portion of a second axial cross-sectional shape, and a third sub-portion of the first axial cross-sectional shape. To this end, the first curved portions 121 may include any suitable number of sub-portions of any suitable number of axial cross-sectional shapes. Moreover, the axial cross-sectional shapes of the various sub-portions may blend into one another. It is noted that the variance in the cross-sectional shaped may be utilized to ensure uniform tensioning of the mask when welded to a mask frame. In addition, although the openings 111a, 111b are shown in portions of the body 110 between first curved portions 121, the openings 111a, 111b may be additionally (or alternatively) positioned in association with the first curved portions 121.

With continued reference to FIGS. 1 and 2, the first curved portions 121 may be formed in portions of the body 110 where the openings 111a, 111b are not formed. For example, when the openings 111a, 111b are formed in an imaginary line crossing the body 110, a first curved portion 121 may be formed between a first opening 111a, 111b in a first imaginary line and another opening 111a, 111b in another imaginary line adjacent to the first line. When the openings 111a, 111b form a pattern, the curved portions 121 may be formed between the openings 111a, 111b. In this manner, the openings 111a, 111b may be spaced apart from one another by a second dimension (or pitch) P2. With specific reference to FIG. 2, the pattern of openings 111b may be further spaced apart from one another by a third dimension (or pitch) P3.

Although FIGS. 1 and 2 illustrate the first curved portions 121 longitudinally extending from substantially one side of body 110 to substantially another side of body 110, it is contemplated that the first curved portions 121 may be formed in one or more determined areas of the body 110. That is, the first curved portions 121 may not longitudinally extend from substantially one side to substantially another of the mask 100. For example, although not illustrated, the first curved portions 121 may be formed in only a central area of the body 110. As another example, the first curved portions 121 may be formed only in an adjacent area to one or more edges of the body 110. Again, however, it is contemplated that the first curved portions 121 may be disposed in any suitable number of portions (or areas) of the body 110 and the first curved portions 121 may longitudinally extend across a portion of the body 110 or from one side (or substantially one side) to another (or substantially another) of the body 110. To this end, some of the first curved portions 110 may longitudinally extend from one side (or substantially one side) to another (or substantially another) of the body 110, whereas other ones of the first curved portions 121 may not extend from one side (or substantially one side) to another (or substantially another) of the body 110.

According to exemplary embodiments, the modified portion 120 formed in the structure may be made of the same material as the body 110. It is contemplated, however, that the modified portion 120 may be made of a different material from the body 110. For example, the material of the modified portion 120 may include one or more metals, such as, for instance, chromium (Cr), copper (Cu), nickel (Ni), magnesium (Mg), iron (Fe), tin (Sn), titanium (Ti), aluminum (Al), stainless steel (SUS), etc., or one or more compounds and/or layers thereof. It is also contemplated that the modified portion 120 may be made of any suitable polymer. The polymer may be a compound consisting of molecules in which one kind or many kinds of constituent units are polymerized by chemical bonds connected to each other.

Figure 3:
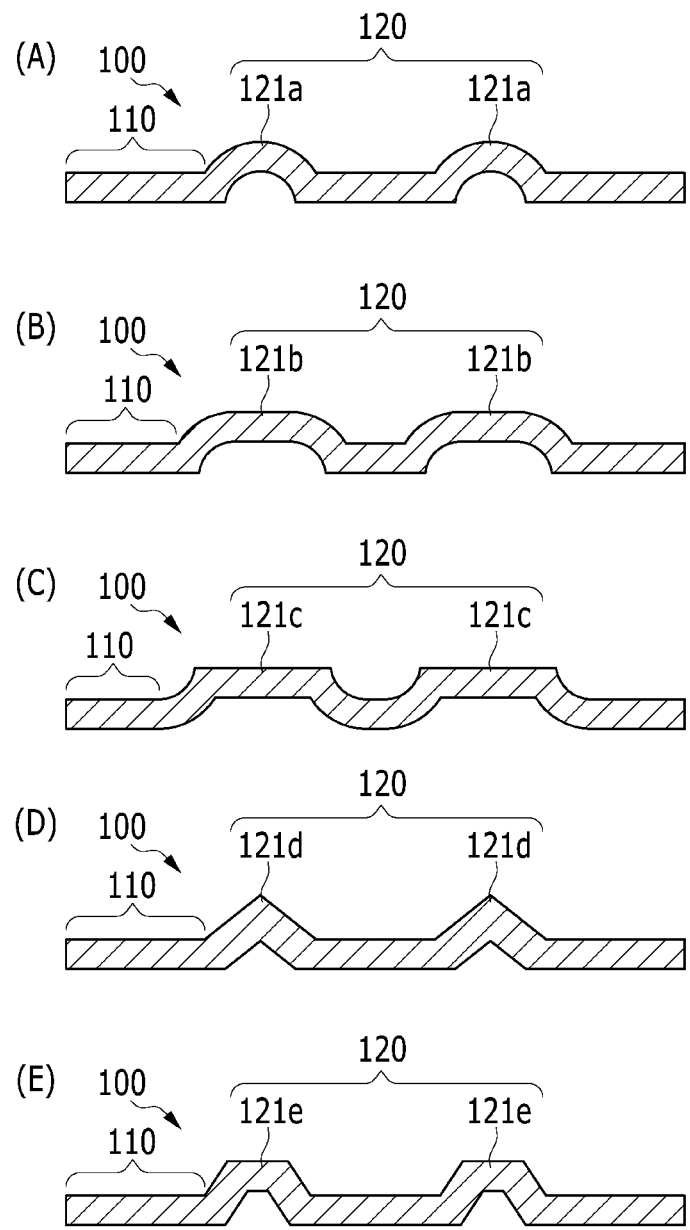
FIG. 3A is a cross-sectional view of the mask of FIG. 2 taken along sectional line A-A', according to exemplary embodiments.
FIGS. 3B to 3E are respective cross-sectional views of various other modified portions of illustrative masks, according to exemplary embodiments.
Figure 4:
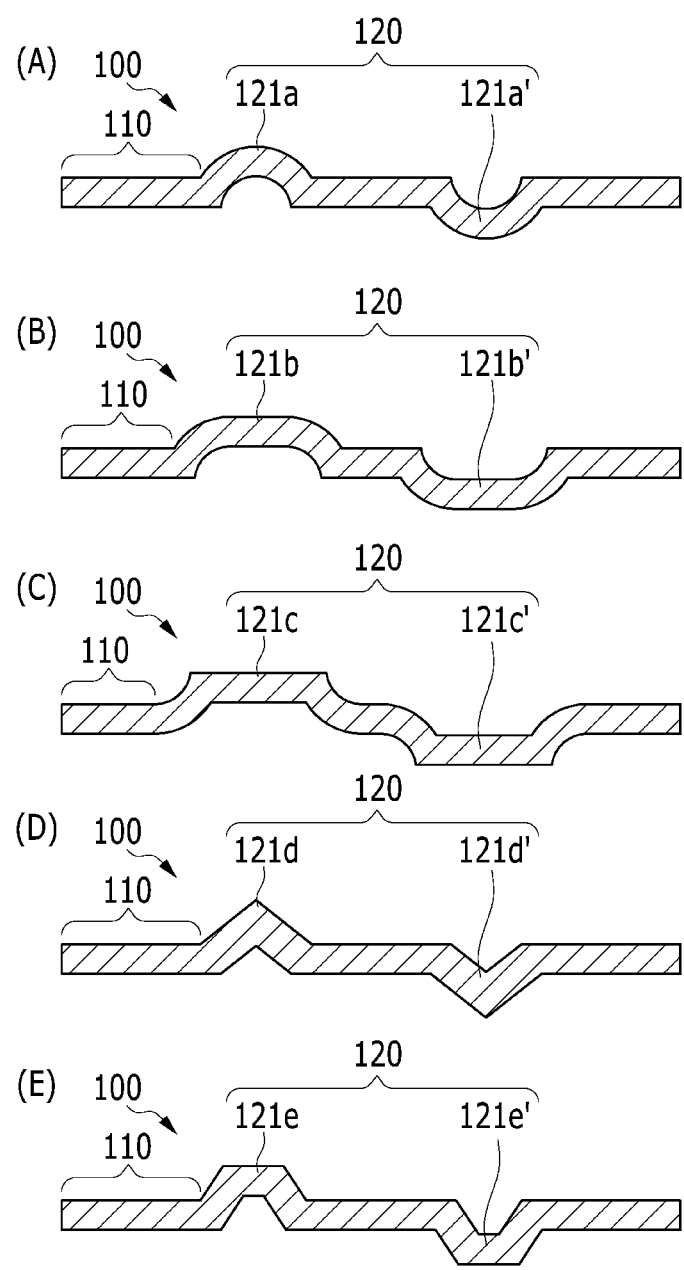
FIGS. 4A to 4E are respective cross-sectional views of various other modified portions of illustrative masks, according to exemplary embodiments.

As previously mentioned, the cross-section of the first curved portions 121 may include arcuately and/or linearly formed features, examples of which will be described in more detail in association with FIGS. 3A to 3E. FIG. 3A is a cross-sectional view taken of the mask of FIG. 2 taken along sectional line A-A', according to exemplary embodiments. FIGS. 3B to 3E are respective cross-sectional views of various other modified portions of illustrative masks, according to exemplary embodiments. It is noted that FIGS. 3A to 3E are provided merely as examples of axial cross-sections of first curved portions 121, and, therefore, it is contemplated that any other suitable cross-sectional shape of the first curved portions 121 may be utilized.

Referring to FIGS. 3A to 3E, a shape of an axial cross-section of the modified portion 120 may be a semi-circle, a semi-oval, a polygonal configuration, etc. For example, as illustrated in FIG. 3A, the shape of the first curved portions 121 may be semicircular. As seen in FIG. 3B, the shape of the first curved portions 121b may be semiovular. In FIG. 3D, the shape of the first curved portions 121d is shown as triangular. In FIG. 3E, the shape of the first curved portions 121e is illustrated as trapezoidal. In addition, as illustrated in FIG. 3C, a portion adjacent to the body 110 of the modified portion 120 may be curved and a top portion may be planar. In other words, modified portion 120 may include first curved portions 121c of a plateau-like configuration.

As seen in each of FIGS. 3A to 3E, the various curved portions 121 and 121b-121e each substantially protrude in the same direction, e.g., the third direction, from a surface of the body 110 of the respective masks. Although not illustrated, the various curved portions 121 and 121b-121e may be configured to substantially protrude in a direction opposite of the third direction, e.g., substantially protrude from a bottom surface of the body 110, such as, for example, substantially protrude in a "negative" third direction. To this end, modified portion 120 may include a first curved portion 121 substantially protruding in the third direction and a second first curved portion 121 substantially protruding in the negative third direction, which is described in more detail in association with FIGS. 4A to 4E.

FIGS. 4A to 4E are respective cross-sectional views of various other modified portions of illustrative masks, according to exemplary embodiments.

As illustrated in FIGS. 4A to 4E, the modified portion 120 may be formed including at least one first curved portion (e.g., curved portion 121a, 121b, 121c, 121d, or 121e) that substantially protrudes in the third direction (e.g., in an upward direction) and at least one second curved portion (e.g., curved portion 121a', 121b', 121c', 121d', or 121e') that substantially protrudes in the negative third direction (e.g., in a downward direction). In this manner, when the mask 100 includes a plurality of modified portions 120, the first curved portions (e.g., curved portions 121a, 121b, 121c, 121d, or 121e) may alternate with the second curved portions (e.g., curved portions 121a, 121b, 121c, 121d, or 121e).

Referring back to FIG. 1, before the mask 100 is coupled to a mask frame (not illustrated), the shape of the modified portion 120 may maintain its protruding shape from the body 110. When, however, the mask 100 is tensioned and coupled to the mask frame, the modified portion 120 may be gradually stretched by one or more external forces, and, thereby, become modified. For instance, when the mask 100 is tensioned and coupled to the mask frame, the modified portion 120 may be flattened. That is, when the mask 100 is tensioned, the modified portion 120 may be stretched, such that the respective protrusions (e.g., first curved portions 121) from body 110 are reduced in the extent of their protrusion, but a thickness of the material is not decreased. It is contemplated that the first curved portions 121 may be flattened to be substantially co-planar with the other portions of the body 110. As such, the thickness of the mask 100 may be maintained with substantially the same initial thickness of the plate shaped material. In this manner, the overall durability may be increased, which may prevent (or otherwise reduce) damage or breakage due to durability issues associated with, for instance, a tension welding process, a deposition process, a cleaning process, etc.

According to exemplary embodiments, the configuration of mask 100 enables a production process use time to be increased due, at least in part, to the increase in durability of the mask 100. To this end, manufacturing costs may be reduced, as the number of additional masks 100 may be reduced. With lower manufacturing costs, the cost of, for example, an OLED display manufactured using the mask 100 may be reduced, which may reduce costs to consumers. Further, when the mask 100 is tension-welded to a mask frame, even though a relative high amount of tension may be applied to the mask 100, the mask 100 may resist thickness decreasing effects of the external force. As a result, when a large-area OLED display is to be manufactured, even though an overall size of the mask 100 may be increased, the thickness of the plate-shaped material of the mask 100 may be stably maintained, which may increase the reliability of the mask 100 during one or more deposition processes.

According to exemplary embodiments, a mask may include a matrix-like formation of protrusions and/or openings. This will be described in more detail in association with FIGS. 5, 6A to 6C, 7A, 7B, 8A, and 8B.

Figure 5:
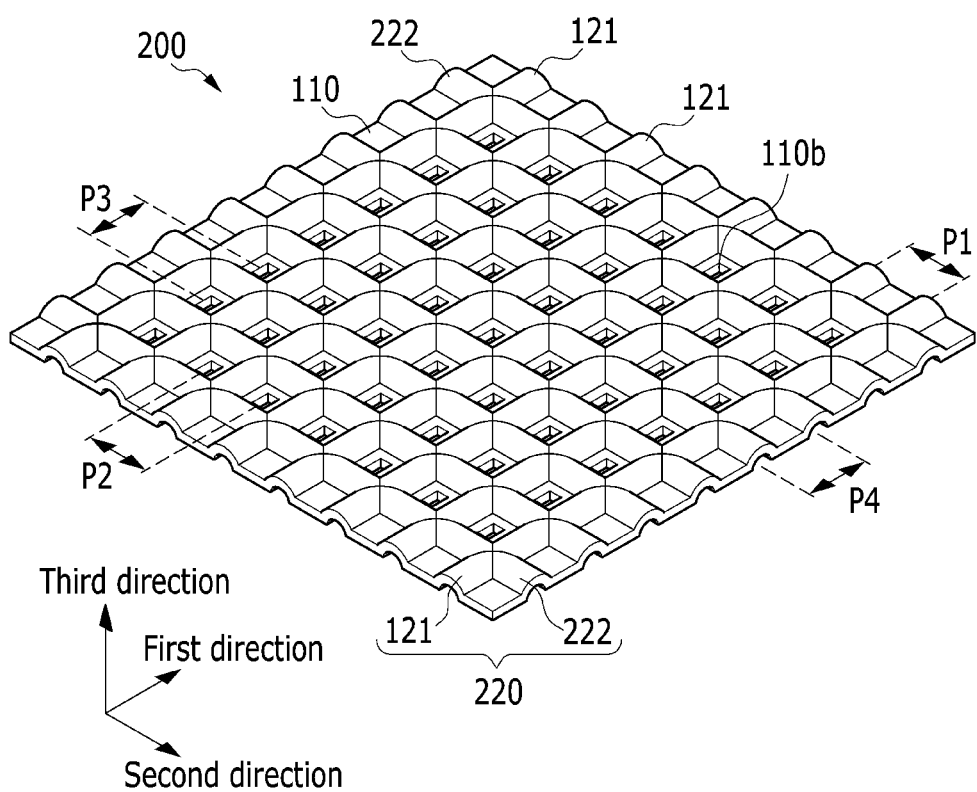
FIG. 5 is a perspective view of a mask, according to exemplary embodiments.

FIG. 5 is a perspective view of a mask, according to exemplary embodiments.

Referring to FIG. 5, a mask 200 may include a modified portion 220. The modified portion 220 may include at least one first curved portion 121 and at least one second curved portion 222. Although described as first and second "curved" portions 121 and 222, an axial cross-section, e.g., a cross-section taken along a sectional line extending in the second direction of the first "curved" portions 121 and a cross-section taken alone a sectional line extending in the first direction of the second "curved" portions 222, may include arcuately formed features and/or linearly formed features.

In exemplary embodiments, the first curved portion 121 substantially protrudes from the surface of the body 110 in the third direction, as well as longitudinally extends in the first direction. The second curved portion 222 substantially protrudes from the body 110 in third direction, as well as longitudinally extends in the second direction. As previously mentioned, the first, second, and third directions may be perpendicular (or substantially perpendicular) to one another.

As seen in FIG. 5, the mask 200 may include respective pluralities of the first and second curved portions 121 and 222. In this manner, the first curved portions 121 may be spaced apart from one another by the first dimension P1, whereas the second curved portions 222 may be spaced apart from one another by a fourth dimension (or pitch) P4. To this end, the plurality of first curved portions 121 may intersect with the plurality of second curved portions 222, such that portions of the body 110 may be bounded by respective sub-portions of two first curved portions 121 and two second curved potions 222. In this manner, the bounded portions of the body 110 may extend in the first direction by dimension P4 and extend in the second direction by dimension P1. To this end, openings 111b may be formed in one or more of the bounded portions of the body 110. In exemplary embodiments, the configuration of the second curved portions 222 are substantially similar to the configuration of the first curved portions 121 (sans the longitudinal direction of extension), and, therefore, to avoid obscuring exemplary embodiments described herein, duplicative descriptions are omitted. The first curved portions 121 and the second curved portions 222 may be disposed in a pattern including at least one row and at least one column of alternating openings 111b and first curved portions 121 and second curved portions 222.

Although the first and second portions 121 and 222 are shown to intersect with one another, it is also contemplated that one or more of the first and second portions 121 and 222 may include a plurality of spaced apart sub-portions that are spaced apart from one another according to a fifth and/or sixth dimension (or pitch). In this manner, the first and second portions 121 and 222 may not intersect with one another. In addition, in FIG. 5, although the first and second curved portions 121 and 222 are formed over the entire body 110, it is contemplated that the first and second curved portions 121 and 222 may be formed in determined area(s) of the body 110, such as a central area, one or more areas adjacent to one or more edges of the body 110, etc. Moreover, although not illustrated, first ones of the first and/or second curved portions 121 and 222 may protrude in the third direction, whereas second ones of the first and/or second curved portions 121 and 222 may protrude in the negative third direction. In this manner, the first ones of the first and/or second curved portions 121 and 222 may alternate with the second ones of the first and/or second curved portions 121 and 222. Again, to avoid obscuring exemplary embodiments described herein, duplicative descriptions are omitted, and, therefore, the remainder of the configurations of the first and second curved portions 121 and 222 may be understood with reference to FIGS. 1, 2, 3A to 3E, and 4A to 4E, as well as the corresponding portions of this disclosure.

According to exemplary embodiments, mask 200 includes modified portion 220 that is formed in the first direction and the second direction. As such, when the mask 200 is tensioned in the first direction and/or second direction, the thickness of the plate material of the mask 200 may be maintained, but an overall area occupied by the mask 200 may be increased. It is contemplated, therefore, that the first and second curved portions 121 and 222 may be flattened to be substantially co-planar with the other portions of the body 110. As such, the thickness of the mask 200 may be maintained with substantially the same initial thickness of the plate shaped material. In this manner, the overall durability may be increased, which may prevent (or otherwise reduce) damage or breakage due to durability issues associated with, for instance, a tension welding process, a deposition process, a cleaning process, etc.

According to exemplary embodiments, the configuration of mask 200 may further enable a production process use time to be increased due, at least in part, to the increase in durability of the mask 200. To this end, manufacturing costs may be reduced, as the number of additional masks 200 may be reduced. With lower manufacturing costs, the cost of, for example, an OLED display manufactured using the mask 200 may be reduced, which may reduce costs to consumers. Further, when the mask 200 is tension-welded to a mask frame, even though a relative high amount of tension may be applied to the mask 200, the mask 200 may resist thickness decreasing effects of the external force. As a result, when a large-area OLED display is to be manufactured, even though an overall size of the mask 200 may be increased, the thickness of the plate-shaped material of the mask 200 may be stably maintained, which may increase the reliability of the mask 200 during one or more deposition processes.

As previously mentioned, protruded portions of a mask may be disposed in select areas of the body 110, as may the openings (or apertures). This will be described in more detail in association with FIGS. 6A to 6C, 7A, 7B, 8A, and 8B. Again, it is noted that the protruded portions and openings of the mask illustrated in FIGS. 6A to 6C, 7A, 7B, 8A, and 8B are disposed in matrix-like formations.

Figure 6A:
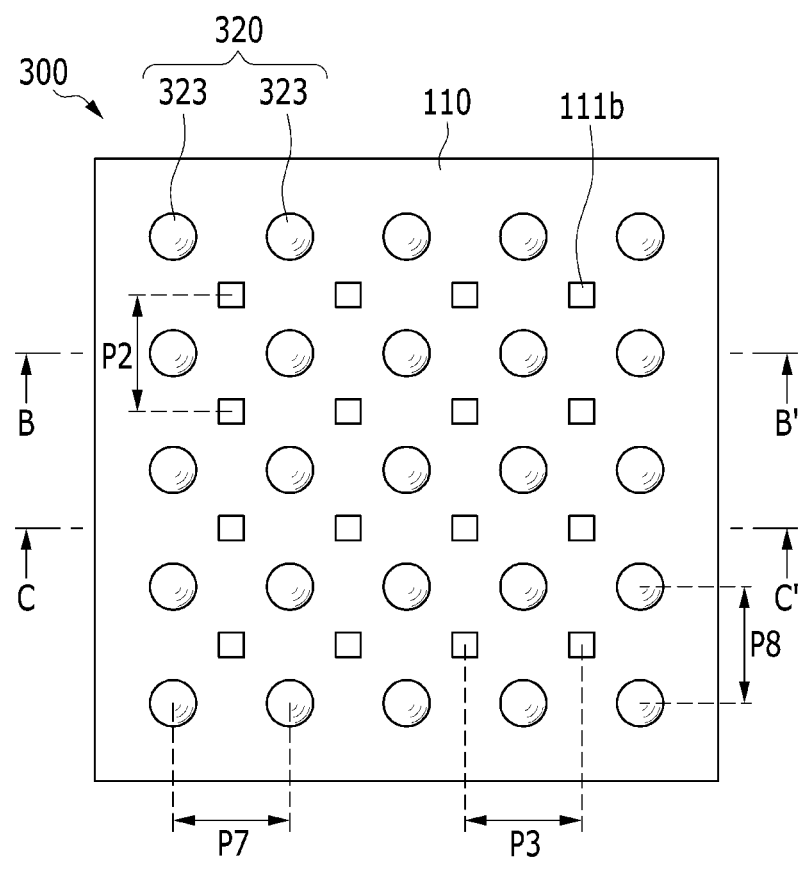
FIG. 6A is a plan view of a mask, according to exemplary embodiments.
Figure 6B:
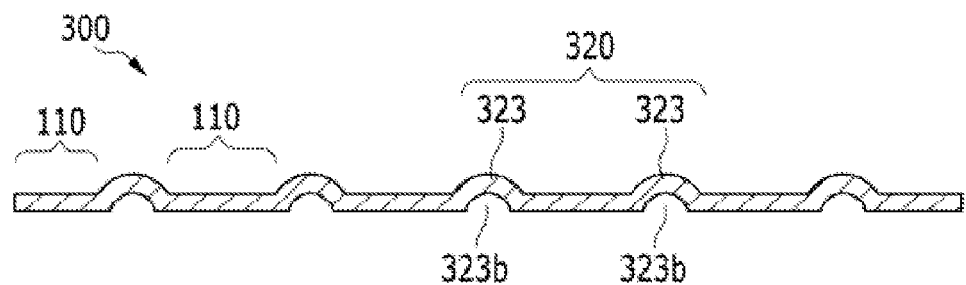
FIG. 6B is a cross-sectional view of the mask of FIG. 6A taken along sectional line B-B', according to exemplary embodiments.
Figure 6C:
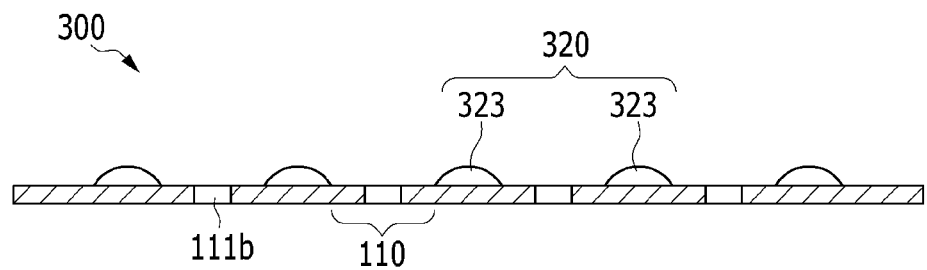
FIG. 6C is a cross-sectional view of the mask of FIG. 6A taken along sectional line C-C', according to exemplary embodiments.

FIG. 6A is a plan view of a mask, according to exemplary embodiments. FIGS. 6B and 6C are respective cross-sectional views of the mask of FIG. 6A taken along corresponding sectional lines B-B' and C-C'.

Referring to FIG. 6A, a mask 300 a body 110 and a modified portion 320. It is noted that the body 110 is substantially the same as the body 110 illustrated in FIGS. 1, 2, and 5, and, therefore, a duplicative description has been omitted to avoid obscuring exemplary embodiments described herein.

According to exemplary embodiments, the modified portion 320 includes a plurality of third curved portions 323 that substantially protrude from the body 110 in the third direction. In this manner, the plurality of third curved portions 323 may be disposed in a pattern or matrix like configuration, as will become more apparent below. In exemplary embodiments, the axial cross-sectional shape of the third curved portion 323 may be one selected from a semicircle, a cone, a prism including any suitable polygonal base, etc. Although each of the third curved portions 323 are shown defining the same axial cross-sectional configuration, it is contemplated that one or more of the curved portions 323 may exhibit one or more different axial cross-sectional configurations. To this end, although described as third "curved" portions 323, the axial cross-sections of the third "curved" portions 323 may include arcuately formed features and/or linearly formed features.

As seen in FIG. 6A, the plurality of third curved portions 323 forms an illustrative pattern including five third curved portions 323 disposed in imaginary first lines extending in the first direction, and five third curved portions 323 disposed in imaginary second line extending in the second direction. That is, body 110 includes a total of twenty-five third curved portion 323. In this manner, respective third curved portions 323 may be spaced apart from one another by a seventh dimension (or pitch) P7 extending in the first direction and spaced apart from one another by an eighth dimension (or pitch) P8 extending in the second direction. It is contemplated, however, that body 110 may include any suitable number and/or configuration of protrusions.

According to exemplary embodiments, the mask 300 may include a plurality of openings 111b, which may be similarly configured as openings 111b of FIGS. 2 and 5. As such, to avoid obscuring exemplary embodiments described herein, a duplicative description has been omitted. It is noted, however, that the third curved portions 323 may be disposed in a space between respective pairs of openings 111b spaced apart in the first and second directions. For instance, respective ones of the third curved portions 323 may be disposed in a central region between respective pairs of openings 111b spaced apart in the first and second directions. In other words, a third curved portion 323 may be disposed at the intersection of two imaginary diagonal lines which may also be considered as imaginary diagonal row and diagonal column lines, extending between respective pairs of adjacently disposed openings 111b spaced apart from one another in respective diagonal directions extending between the first and second directions. In this manner, as illustrated in FIGS. 6B and 6C, the third curved portions 323 may not be positioned between adjacently disposed openings 111b in the first and second directions. For example, as seen in FIGS. 6B and 6C, openings 111 b are not disposed between third curved portions 323 disposed along the same imaginary line extending in the first direction. It is noted, however, that respective openings 111b disposed along the same imaginary diagonal line, e.g., imaginary diagonal row line or imaginary diagonal column line may be disposed between third curved portions 323 disposed along the same imaginary diagonal line. Further, as seen in FIG. 6B, mask 300 may include third curved portions 323 protruding from a first surface of mask 300 and depressions 323b in a second surface of mask 300. The third curved portions 323 may overlap the depressions 323b. To this end, as seen in FIGS. 1, 2, 3A to 3E, 4A to 4E, 5, 7B, and 8B, masks 100, 200, 400, and 500 may also include similar depressions as described in association with FIG. 6B. Further, as seen in FIGS. 5, 6A, 7A, and 8A, patterns of curved portions and openings may be formed including at least one row and at least one column of alternating curved portions and openings. It is noted that the at least one row and at least one column may be formed in respective diagonal directions.

Although not illustrated, the third curved portions 323 may not be disposed over substantially the entire body 110. In other words, the disposition of the third curved portions 323 may be limited to one or more select areas of the body 110. For example, the select areas may be a central area, one or more areas disposed adjacent to one or more edges of the body 110, etc. For instance, body 110 may include three third curved portions 323 disposed in respective imaginary lines extending in the first direction, and three third curved portions 323 disposed in respective imaginary lines extending in the second direction, such that the body includes nine third curved portions 323 disposed only in a central area of the body 110. As another example, the body may include one or more third curved portions 323 disposed adjacent to one or more edges of the body 110, such that no third curved portions 323 are disposed in a central area of the body 110. It is contemplated, however, that any other suitable arrangement and/or number of protrusions (e.g., third curved portions 323) may be utilized.

According to exemplary embodiments, mask 300 includes modified portion 320 including third curved portions 323 that may be selectively disposed about the mask 300. As such, when the mask 300 is tensioned in the first direction and/or second direction, the thickness of the plate material of the mask 300 may be maintained, but an overall area occupied by the mask 300 may be increased. It is contemplated, therefore, that the third curved portions 323 may be flattened to be substantially co-planar with the other portions of the body 110. As such, the thickness of the mask 300 may be maintained with substantially the same initial thickness of the plate shaped material. In this manner, the overall durability may be increased, which may prevent (or otherwise reduce) damage or breakage due to durability issues associated with, for instance, a tension welding process, a deposition process, a cleaning process, etc.

According to exemplary embodiments, the configuration of mask 300 may further enable a production process use time to be increased due, at least in part, to the increase in durability of the mask 300. To this end, manufacturing costs may be reduced, as the number of additional masks 300 may be reduced. With lower manufacturing costs, the cost of, for example, an OLED display manufactured using the mask 300 may be reduced, which may reduce costs to consumers. Further, when the mask 300 is tension-welded to a mask frame, even though a relative high amount of tension may be applied to the mask 300, the mask 300 may resist thickness decreasing effects of the external force. As a result, when a large-area OLED display is to be manufactured, even though an overall size of the mask 300 may be increased, the thickness of the plate-shaped material of the mask 300 may be stably maintained, which may increase the reliability of the mask 300 during one or more deposition processes.

According to exemplary embodiments, mask 300 includes modified portion 320 that is formed in the first direction and the second direction. As such, when the mask 300 is tensioned in the first direction and/or second direction, the thickness of the plate material of the mask 300 may be maintained, but an overall area occupied by the mask 300 may be increased. It is contemplated, therefore, that the third curved portions 323 may be flattened to be substantially co-planar with the other portions of the body 110. As such, the thickness of the mask 300 may be maintained with substantially the same initial thickness of the plate shaped material. In this manner, the overall durability may be increased, which may prevent (or otherwise reduce) damage or breakage due to durability issues associated with, for instance, a tension welding process, a deposition process, a cleaning process, etc.

According to exemplary embodiments, the configuration of mask 300 may further enable a production process use time to be increased due, at least in part, to the increase in durability of the mask 300. To this end, manufacturing costs may be reduced, as the number of additional masks 300 may be reduced. With lower manufacturing costs, the cost of, for example, an OLED display manufactured using the mask 300 may be reduced, which may reduce costs to consumers. Further, when the mask 300 is tension-welded to a mask frame, even though a relative high amount of tension may be applied to the mask 300, the mask 300 may resist thickness decreasing effects of the external force. As a result, when a large-area OLED display is to be manufactured, even though an overall size of the mask 300 may be increased, the thickness of the plate-shaped material of the mask 300 may be stably maintained, which may increase the reliability of the mask 300 during one or more deposition processes.

Figure 7A:
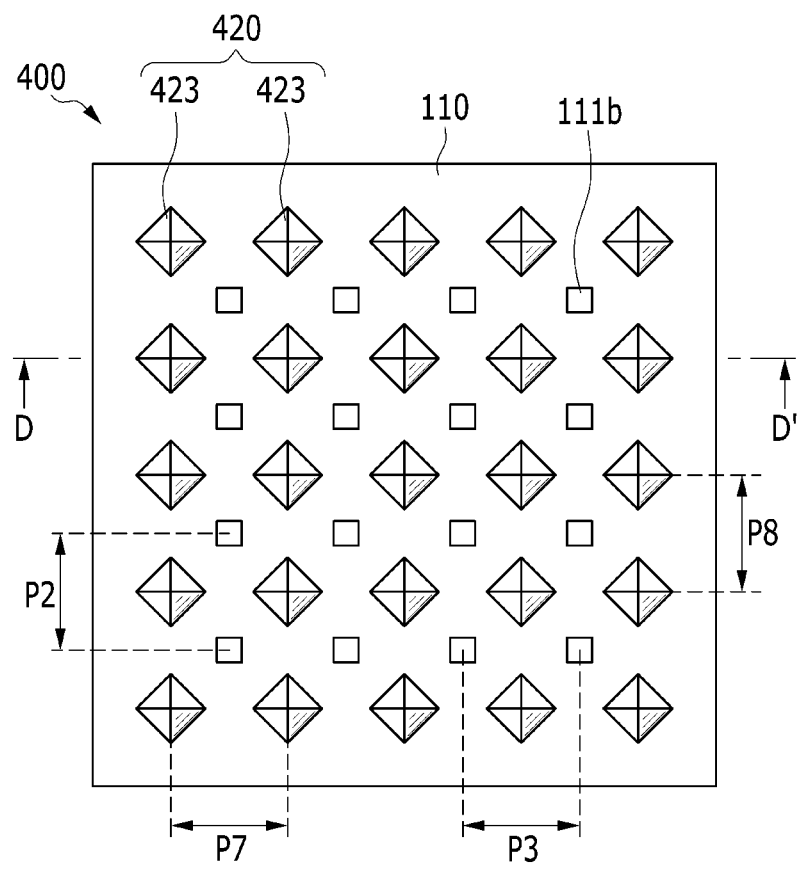
FIG. 7A is a plan view of a mask, according to exemplary embodiments.
Figure 7B:
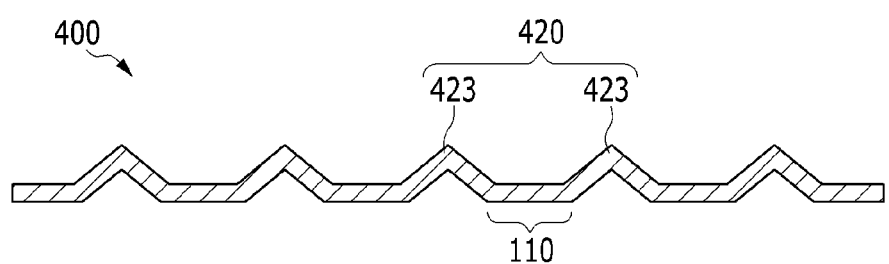
FIG. 7B is a cross-sectional view of the mask of FIG. 7A taken along sectional line D-D', according to exemplary embodiments.

As previously mentioned, the third curved portions 323 may be configured with one or more alternative, axial cross-sectional shapes, one of which is described in more detail in association with FIGS. 7A and 7B. FIG. 7A is a plan view of a mask, according to exemplary embodiments. FIG. 7B is a cross-sectional view of the mask of FIG. 7A taken along sectional line D-D'.

Referring to FIGS. 7A and 7B, mask 400 may be substantially the same as mask 300 of FIGS. 6A to 6C; however, mask 400 may include modified portion 420 in addition to or instead of modified portion 320. In exemplary embodiments, modified portion 420 includes one or more fourth curved portion 423, which may include axial cross-sectional shapes corresponding to prisms or pyramids with any suitable polygonal base, e.g., a rectangular pyramid as seen in FIGS. 7A and 7B. It is contemplated, however, that any other suitable axial cross-sectional configuration may be utilized, e.g., a triangular prisms/pyramids, rectangular prisms/pyramids, pentagonal prisms/pyramids, and/or the like. It is noted that a remainder of the features of mask 400 may be substantially similar to one or more of masks 100, 200, and/or 300, and, therefore, to avoid obscuring exemplary embodiments described herein, a duplicated description has been omitted. To this end, it is noted that the features, functions, and benefits arising from mask 400 may be similar to those achieved in association with one or more of masks 100, 200, and/or 300.

Figure 8A:
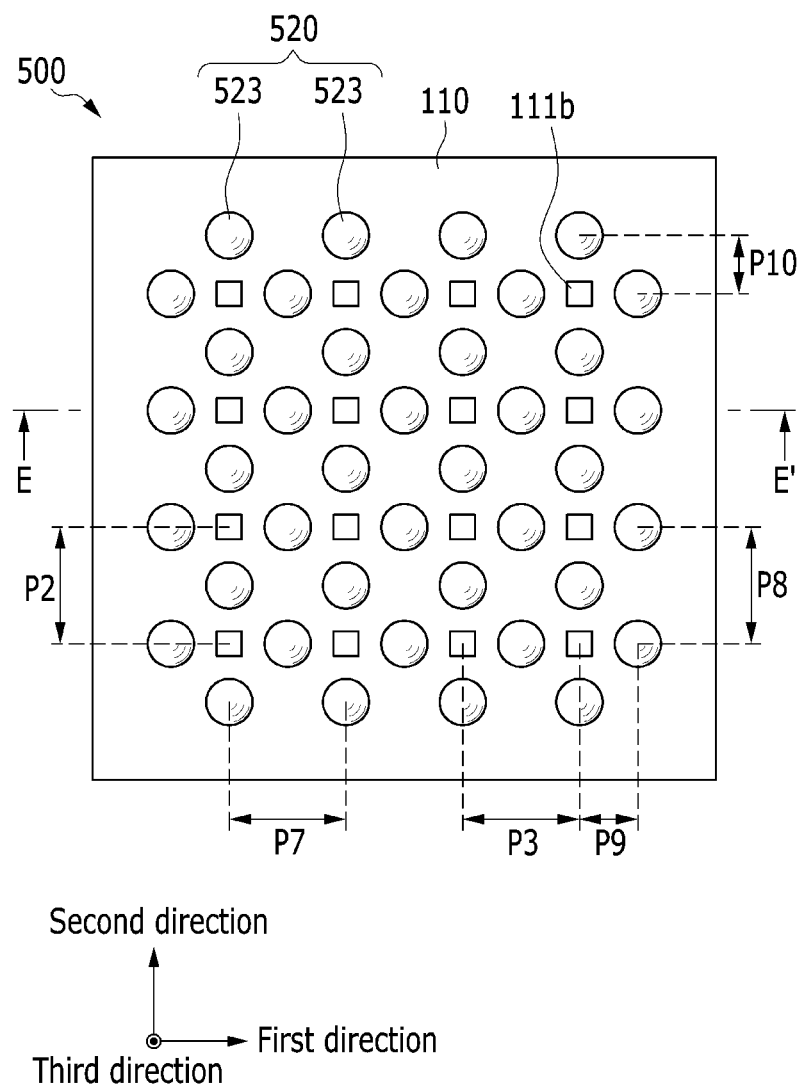
FIG. 8A is a plan view of a mask, according to exemplary embodiments.
Figure 8B:
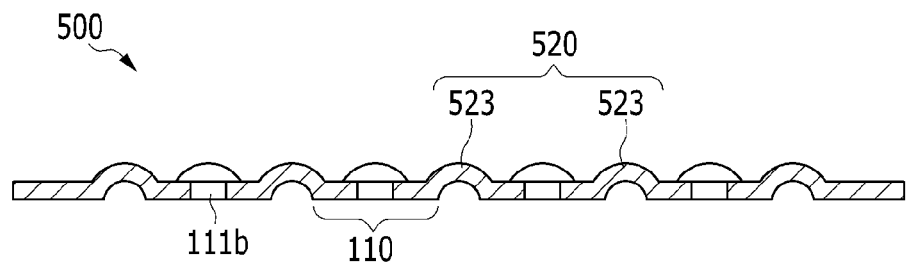
FIG. 8B is a cross-sectional view of the mask of FIG. 8A taken along sectional line E-E', according to exemplary embodiments.

As previously mentioned, the matrix configuration of the protrusions (e.g., third curved portions 323) and/or the openings (e.g., openings 111b) may be configured in any suitable matrix-like or other suitable patterned formation. An exemplary alternative (or additional) matrix-like configuration is described in more detail in association with FIGS. 8A and 8B. FIG. 8A is a plan view of a mask, according to exemplary embodiments. FIG. 8B is a cross-sectional view of the mask of FIG. 8 taken along sectional line E-E'. It is noted that mask 500 of FIGS. 8A and 8B may be substantially similar as mask 300 of FIGS. 6A to 6C except for the disposition of the protrusion portions and openings. As such, differences are described below to avoid obscuring exemplary embodiments described herein.

Referring to FIGS. 8A and 8B, mask 500 includes body 110, which includes modified portion 520 and openings 111*b*. Modified portion 520 includes one or more fifth curved portions 523. According to exemplary embodiments, at least some of the fifth curved portions 523 are spaced apart from one another in the first direction by the seventh dimension P7, as well as spaced part from one another in the second direction by the eighth dimension P8. To this end, at least some of the fifth curved portions 523 are spaced apart, in the first direction, from other ones of the fifth curved portions 523 by a ninth dimension (or pitch) P9. Further, at least some of the fifth curved portions 523 are spaced apart, in the second direction, from other ones of the fifth curved portions 523 by a tenth dimension (or pitch) P10. In this manner, the fifth curved portions 523 may be staggered from one another, which may form diamond-like configurations of fifth curved portions 523.

According to exemplary embodiments, openings 111*b* may be disposed in a central region of at least some of the diamond-like configurations. As such, each opening 111*b* may be disposed adjacent to respective fifth curved portions 523 disposed above and below the opening 111*b* in the second direction, and disposed to the right and left one of the opening 111*b* in the second direction. In this manner, at least some of the fifth curved portions 523 may be disposed in association with imaginary lines extending in the second direction that include openings 111*b* disposed along the same imaginary line, whereas other ones of the fifth curved portions 523 may be disposed in association with imaginary lines extending in the second direction that do not include openings 111*b* disposed along the corresponding imaginary line. To this end, at least some of the fifth curved portions 523 may be disposed in association with imaginary lines extending in the first direction that include openings 111*b* disposed along the same imaginary line, whereas other ones of the fifth curved portions 523 may be disposed in association with imaginary lines extending in the first direction that do not include openings 111*b* disposed along the corresponding imaginary line.

It is noted that a remainder of the features of mask 500 may be substantially similar to one or more of masks 100, 200, 300 and/or 400, and, therefore, to avoid obscuring exemplary embodiments described herein, a duplicated description has been omitted. To this end, it is noted that the features, functions, and benefits arising from mask 500 may be similar to those achieved in association with one or more of masks 100, 200, 300, and/or 400.

Although certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A mask, comprising:
 a plate-shaped body comprising openings; and
 a modified portion comprising:
  at least one first curved portion protruding from the plate-shaped body in a first direction and longitudinally extending in a second direction;
  at least one second curved portion protruding from the plate-shaped body in the first direction and longitudinally extending in a third direction,
 wherein the second direction and the third direction are substantially perpendicular to one another.

2. The mask of claim 1, wherein:
 the at least one first curved portion is one of a plurality of first curved portions;
 the plurality of first curved portions are spaced apart from one another; and
 the openings are positioned between respective pairs of the plurality of first curved portions.

3. The mask of claim 1, wherein the at least one first curved portion is disposed in one or more limited areas of the plate-shaped body.

4. The mask of claim 3, wherein the one or more limited areas correspond to a central area of the plate-shaped body.

5. The mask of claim 3, wherein the one or more limited areas are disposed adjacent to one or more edges of the plate-shaped body.

6. The mask of claim 1, wherein the shape of an axial cross-section of the first curved portion is a semicircle, a semioval, or a polygon.

7. The mask of claim 1, wherein:
 the at least one second curved portion is one of a plurality of second curved portions;
 the plurality of second curved portions are spaced apart from one another; and
 the openings are disposed between respective pairs of the plurality of second curved portions.

8. The mask of claim 1, wherein the plurality of second curved portions are disposed in one or more limited areas of the plate-shaped body.

9. The mask of claim 8, wherein the one or more limited areas correspond to a central area of the plate-shaped body.

10. The mask of claim 8, wherein the one or more limited areas are disposed adjacent to one or more edges of the plate-shaped body.

11. The mask of claim 1, wherein the shape of an axial cross-section of at least some of the plurality of second curved portions is a semicircle, a semioval, or a polygon.

12. The mask of any one of claims 1, wherein the first direction extends upward or downward from the plate-shaped body.

13. The mask of claim 1, wherein the modified portion comprises at least one of chromium, copper, nickel, magnesium, iron, tin, titanium, aluminum, and stainless steel.

14. The mask of claim 1, wherein the modified portion is formed from a polymer.

15. The mask of claim 1, wherein the modified portion is formed from the same material as or a different material from the plate-shaped body.

16. The mask of any one of claims 1, wherein the modified portion is configured to stretch under tension of the plate-shaped body to:
 enable a thickness of the plate-shaped body to be substantially maintained; and
 enable at least one other dimension of the plate-shaped body to increase.

17. A mask, comprising:
a plate-shaped body comprising openings; and
a modified portion comprising:
  protrusions protruding from a first surface of the plate-shaped body; and
  depressions in a second surface of the plate-shaped body, the protrusions overlapping the depressions,
wherein the protrusions are disposed in a pattern, the pattern comprising at least one row and at least one column of alternating protrusions and openings.

18. The mask of claim 17, wherein the protrusions are disposed in one or more limited areas of the plate-shaped body.

19. The mask of claim 18, wherein the one or more limited areas correspond to a central area of the plate-shaped body.

20. The mask of claim 18, wherein the one or more limited areas are disposed adjacent to one or more edges of the plate-shaped body.

21. The mask of claim 17, wherein the shape of an axial cross-section of at least some of the protrusions is a hemisphere, a cone, a polygonal prism, or a polygonal pyramid.

22. The mask of claim 17, wherein the at least one row and the at least one column are formed diagonally across the plate-shaped body.

23. A mask, comprising:
a plate-shaped body comprising openings; and
a modified portion comprising at least two curved portions protruding from the plate-shaped body, the at least two curved portions comprising:
  at least one curved portion protruding in a first direction; and
  at least one curved portion protruding in a second direction opposite the first direction,
wherein the at least two curved portions longitudinally extend in a third direction.

* * * * *